United States Patent
Eberhardt et al.

(10) Patent No.: US 8,772,821 B2
(45) Date of Patent: Jul. 8, 2014

(54) OPTOELECTRONIC SEMICONDUCTOR PART CONTAINING ALKALI-FREE AND HALOGEN-FREE METAL PHOSPHATE

(75) Inventors: Angela Eberhardt, Augsburg (DE); Christina Wille, Friedberg (DE); Joachim Wirth-Schön, Günzburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/696,744

(22) PCT Filed: Apr. 20, 2011

(86) PCT No.: PCT/EP2011/056292
§ 371 (c)(1),
(2), (4) Date: Nov. 7, 2012

(87) PCT Pub. No.: WO2011/138169
PCT Pub. Date: Nov. 10, 2011

(65) Prior Publication Data
US 2013/0056782 A1  Mar. 7, 2013

(30) Foreign Application Priority Data
May 7, 2010  (DE) .......................... 10 2010 028 776

(51) Int. Cl.
H01L 33/00 (2010.01)
C03C 3/17 (2006.01)
G02B 19/00 (2006.01)
H01L 33/48 (2010.01)
C03C 27/00 (2006.01)
H01L 33/50 (2010.01)
H01L 33/58 (2010.01)
G02B 27/09 (2006.01)

(52) U.S. Cl.
CPC .............. *C03C 3/17* (2013.01); *G02B 19/0028* (2013.01); *G02B 19/0061* (2013.01); *H01L 33/501* (2013.01); *H01L 33/58* (2013.01); *H01L 33/48* (2013.01); *G02B 19/0095* (2013.01); *G02B 27/0916* (2013.01); *C03C 27/00* (2013.01)
USPC  257/99; 257/98; 257/E33.056; 257/E33.058; 257/E33.067

(58) Field of Classification Search
USPC ...................... 257/98, 99, E33.056, E33.058, 257/E33.067, E33.072, E33.073
See application file for complete search history.

(56) References Cited

U.S. PATENT DOCUMENTS 2,538,867 A  1/1951  Greger
3,870,737 A  3/1975  Birchall et al.
(Continued)

FOREIGN PATENT DOCUMENTS

DE  101 13 287  10/2002
DE  101 18 630  10/2002
(Continued)

OTHER PUBLICATIONS

P.E. Stone, et al., "Phase Relationships in the System $CaO-Al_2O_3-P_2O_5$", Journal of the American Ceramic Society—Stone, Egan, and Lehr, vol. 30, No. 3, pp. 89-98.
(Continued)

*Primary Examiner* — Victor A Mandala
(74) *Attorney, Agent, or Firm* — Cozen O'Connor

(57) ABSTRACT

An optoelectronic semiconductor part comprising a light source, a housing and electrical connections, wherein the optoelectronic semiconductor part comprises a component which contains metal phosphate, and wherein the metal phosphate is substantially alkali-free and halogen-free.

10 Claims, 2 Drawing Sheets

(56) References Cited

U.S. PATENT DOCUMENTS

| | | |
|---|---|---|
| 3,885,974 A | 5/1975 | Asahara et al. |
| 4,771,020 A | 9/1988 | Omata et al. |
| 5,965,469 A | 10/1999 | Kilgo et al. |
| 6,461,415 B1 | 10/2002 | Sambasivan et al. |
| 2004/0207314 A1 | 10/2004 | Aitken et al. |
| 2006/0057407 A1 | 3/2006 | Sambasivan |
| 2006/0127696 A1* | 6/2006 | Stossel et al. ............... 428/690 |
| 2009/0166651 A1 | 7/2009 | Beckers |
| 2010/0095705 A1 | 4/2010 | Burkhalter et al. |

FOREIGN PATENT DOCUMENTS

| | | |
|---|---|---|
| DE | 101 59 544 | 6/2003 |
| DE | 10 2005 023 134 | 11/2006 |
| EP | 2 436 659 | 4/2012 |
| EP | 2 460 780 | 6/2012 |
| JP | 49-061220 | 6/1974 |
| JP | 56-084340 | 7/1981 |
| JP | 2002-223008 | 8/2002 |
| JP | 2002-344026 | 11/2002 |
| JP | 2007-284528 | 11/2007 |
| JP | 2008 034546 | 2/2008 |
| JP | 2008-541465 | 11/2008 |
| WO | WO 2010/048042 | 4/2010 |
| WO | WO 2011/013776 | 2/2011 |

OTHER PUBLICATIONS

Y-F. Liu et al., "Preparation and its luminescent properties of AlP04:Eu3+ phosphor for w-LED applications", Journal of Alloys and Compounds, vol. 509, No. 21, pp. L199-L202, Mar. 16, 2011.

* cited by examiner

OPTOELECTRONIC SEMICONDUCTOR PART CONTAINING ALKALI-FREE AND HALOGEN-FREE METAL PHOSPHATE

RELATED APPLICATIONS

This is a U.S. National Phase Application under 35 USC 371 of International Application PCT/EP2011/056292 filed on Apr. 20, 2011.

This application claims the priority of German application no. 10 2010 028 776.8 filed May 7, 2010, the entire content of which is hereby incorporated by reference.

BACKGROUND OF THE INVENTION

The invention relates to an optoelectronic semiconductor part comprising a light source, a housing and electrical connections.

DE-A 10 11 8630 and DE-A 10 15 9544 disclose LEDs having glass components. U.S. Pat. No. 5,965,469 discloses a phosphate glass which is used as an adhesive.

SUMMARY OF THE INVENTION

It is an object of the present invention to provide an optoelectronic semiconductor part, for example, an LED, having particularly temperature-resistant and weather-resistant gluing or components.

The present invention solves the problem of providing gluing or components for LEDs which are temperature-resistant and weather-resistant. Components of this type increase the efficiency and service life of LEDs.

Conventionally, LEDs have mostly been manufactured with the inclusion of organic components and this has been particularly the case for the board, the lens and/or for conversion elements of the LED. In addition, for gluing, an organic adhesive has often been used, for example, to mount a cover made of glass or to glue a conversion element onto a chip.

Organic components of this type typically have poor thermal conductivity and a low UV-resistance, in particular where resistance to radiation in the region below 420 nm is concerned. Said components are also temperature-sensitive. All these factors result in low efficiency because the LED becomes discolored or is operated at an excessively high temperature.

According to an embodiment of the invention, a metal phosphate is used for gluing or components made of metal phosphate are used. By this means, improved thermal conductivity and improved UV-resistance is achieved. The metal phosphate is preferably lead-free or low in lead, having a content of less than 1 mol-%.

Additives and/or radiation-absorbing elements and/or components altering the refractive index can be added to the metal phosphate. Said components are preferably inorganic. In the case of the metal phosphate, this can be, for example, aluminum phosphate, yttrium phosphate, an alkaline earth phosphate, a phosphate of main group III or the subgroups or other rare earth phosphates. Additives, such as $SiO_2$, for example, in the form of Aerosil, pyrogenic $Al_2O_3$ or $TiO_2$, etc. can be added to the phosphate. Preferably, said additives are added as a nanometer powder and, in particular, the mean particle size thereof is in the range of 1 nm to 40 nm. Ground glasses, for example, hard glasses or ground glass solder can also be added.

Said additives can possibly further increase the thermal conductivity, serve as reflectors or scattering agents or be used to adapt the thermal expansion coefficient.

The addition of radiation-absorbing components for targeted heating, for example, vanadium oxide and/or components with a filter effect, for example, bismuth-containing compounds is also possible. Further components, in particular tellurium-containing compounds are used to alter the refractive index in a specific manner. The metal phosphate is moisture-resistant and is preferably manufactured at low temperatures. Said metal phosphate is also suitable for embedding luminophores, that is, for use as a matrix for a conversion element. The proportion of additives can be high enough such that the metal phosphate especially serves as a binding agent.

The use of the novel adhesive results in enhanced efficiency and an extended service life. For this purpose, gluing or a component made of metal phosphate, possibly with additives which absorb or reflect radiation or alter the refractive index, is used. By this means, an increase in the UV resistance and the thermal conductivity are achieved, as well as an improvement in the temperature stability and possibly an elevated refractive index.

Some or all of the added components can be selected such that said components react chemically with and thereby modify the metal phosphate.

Embodiments of the invention can include the following features:

1. An optoelectronic semiconductor part comprising a light source, a housing and electrical connections, wherein the optoelectronic semiconductor part comprises a component which contains metal phosphate, characterized in that the metal phosphate is substantially alkali-free and halogen-free.
2. The optoelectronic semiconductor part as in feature no. 1 above, wherein the metal phosphate contains no more than 1 mol-% of alkali oxides and halogen-containing components.
3. The optoelectronic semiconductor part as in feature no. 1 above, wherein the metal phosphate contains phosphate as the main component.
4. The optoelectronic semiconductor part as in feature no. 1 above, wherein the metal phosphate contains in the range of 5 mol-% to 75 mol-% of $P_2O_5$ and, in particular in the range of 5 mol-% to 25 mol-% $Al_2O_3$ or $Y_2O_3$.
5. The optoelectronic semiconductor part as in feature no. 1 above, wherein in the range of 0.5 mol-% to 10 mol-% of vanadium V, tellurium Te and or bismuth Bi is added to the metal phosphate in each case.
6. The optoelectronic semiconductor part in feature no. 1 above, wherein inorganic components which increase the refractive index and or serve as fillers and or act as optical filters and or reflect and or reduce reflection and or absorb radiation are added to the metal phosphate.
7. The optoelectronic semiconductor part in feature no. 1 above, wherein the component which contains metal phosphate is an adhesive as a binding agent between two components of the semiconductor part.
8. The optoelectronic semiconductor part in feature no. 1 above, wherein the component which contains metal phosphate is a matrix for a conversion element.
9. The optoelectronic semiconductor part in feature no. 1 above, wherein the component which contains metal phosphate is a housing component or a lens.
10. The optoelectronic semiconductor part in feature no. 1 above, wherein the component which contains metal phosphate is a protective layer for luminophore particles.

11. The optoelectronic semiconductor part in feature no. 1 above, wherein the component which contains metal phosphate is a coating or a matrix of a coating of the conversion element.

DETAILED DESCRIPTION OF THE DRAWINGS

Figure 1:
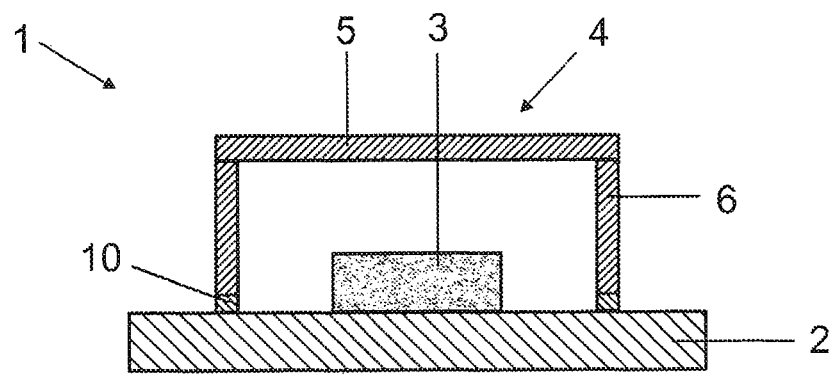
FIG. 1 is a representation of an LED with a glass cover in transverse section.

FIG. 1 shows, in schematic form, an LED 1 having a board 2. Arranged on said board is a chip 3. Said chip is surrounded, at a distance, by a glass cover 4 having a top wall 5 and side walls 6. Integrated into the side wall, in particular, are ventilation slits. The connection between the side wall 6 and the board 2 is achieved with an adhesive trail 10 made of metal phosphate which is preferably alkali-free and halogen-free.

Figure 2:
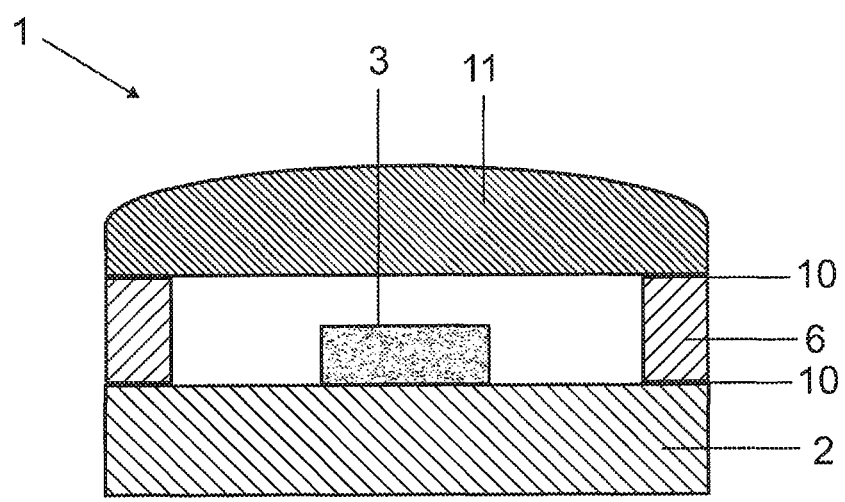
FIG. 2 is a representation of an LED with a lens in transverse section.

FIG. 2 shows, schematically, an LED 1 having a board 2 and a chip 3. Said chip is surrounded, at a distance, by a glass cover. Said glass cover is configured as a lens 11 made of metal phosphate. Said lens is connected via side walls 6 to the board, which is also made of metal phosphate. An adhesive trail 10 made of metal phosphate which contains not more than 1 mol-% of oxides of alkali elements and halogens is used between the lens 11 and the side wall 6, on one side, and between the side wall 6 and the board 2, on the other side. The lens 11 is produced from metal phosphate with up to 1 mol-% of alkali oxides.

Figure 3:
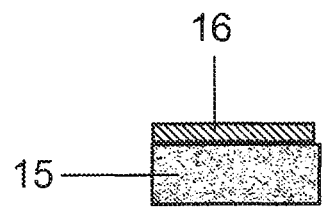
FIG. 3 is a representation of an LED with a conversion element in transverse section.

FIG. 3 shows a chip 15 having a conversion element 16 arranged directly in front of the chip 15. The conversion element 16 is a thin layer which uses metal phosphate as a matrix. Embedded therein are one or more luminophores, as are per se known. Typical luminophores are YAG:Ce, SiONes, nitrides, orthosilicates or calsines. Said luminophores serve, in particular, with the aid of a blue or UV-emitting chip, to generate white light. In a particular embodiment of the exemplary embodiment shown in FIG. 3, the luminophore particles are glued (by adhesion) by the metal phosphate or are surrounded thereby (as a protective layer). In the latter case, the luminophore particles thus passivated are also present in another matrix.

Figure 4:
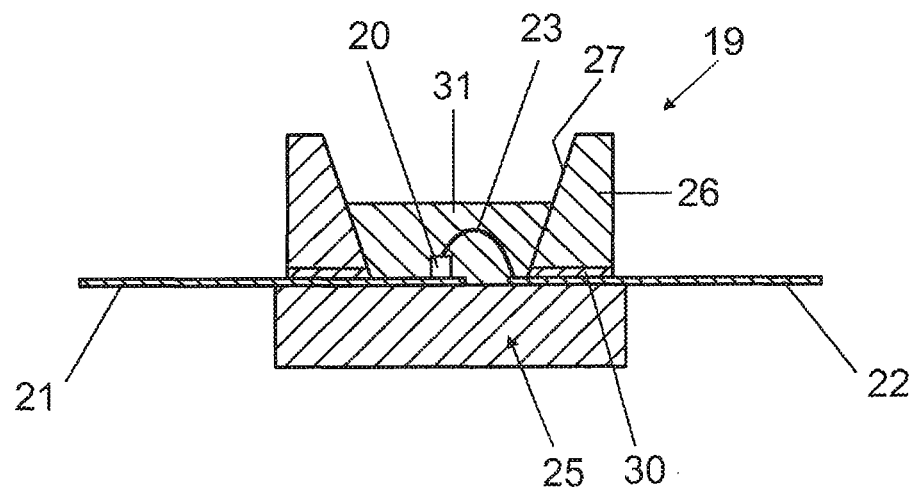
FIG. 4 is a representation of a semiconductor part in section.

FIG. 4 shows an optoelectronic semiconductor part 19 in section. The core is a chip 20 emitting primarily in the UV region and being connected to electrical connections 21, 22 which are configured as lead frame parts. One of said parts is connected via a bonding wire 23 to the chip. The chip 20 is arranged directly on a broad terminal part 21 situated on the surface 25 of a rectangular base body made of glass (quartz glass, hard glass, soft glass or glass solder) or of ceramic material. Positioned on the base body is an annular upper part 26, which leaves free a recess in the interior thereof. The inner inclined wall 27 of the upper part is formed as a reflector. The upper part is connected to the base body and the lead frame, which is formed from the terminals, by means of an inorganic adhesive 30 or solder glass. The adhesive is made of alkali-free and halogen-free metal phosphate. The upper part 26 is also made of glass. The recess within the reflector is filled with a casting resin 31 which incorporates a converting luminophore. In place of the casting resin, a suitable metal phosphate can be used as the matrix. The LED is, in particular, closed with a cover pane and is thereby hermetically sealed.

In particular, the conversion element can be connected to the chip by means of an adhesion made of metal phosphate. The conversion element can also be applied directly onto the chip as a "thin film" element.

The metal phosphate has a low alkali and halogen content and is preferably alkali-free and halogen-free. This means that said elements are not intentionally added and, if they are present, originate from contaminants in the starting materials used. The concentrations of alkali metals and halogens are therefore not significant and are each below 1 mol-%. By this means, ion-laden components are reduced or avoided altogether. This applies, in particular, for ion-forming elements, for example, Na, Cl, K and F. In the presence of moisture, these can enter the LED, thereby attacking the contacts and impairing the charge densities at the chip.

Figure 5:
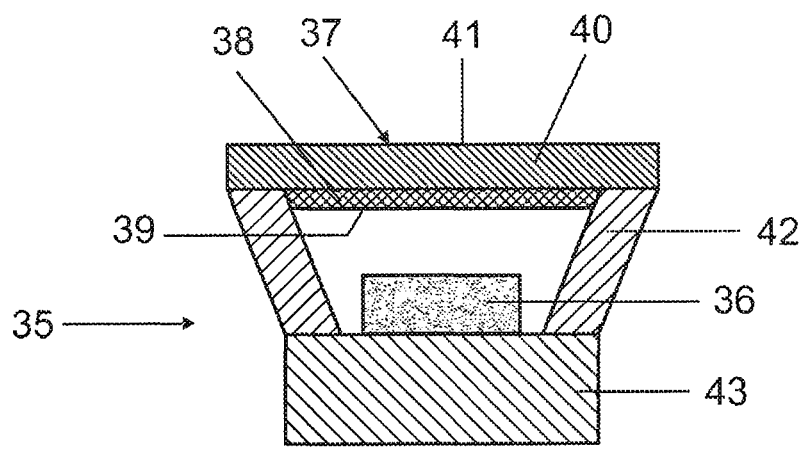
FIG. 5 is a representation of a further exemplary embodiment of a semiconductor part in section.

FIG. 5 shows an optoelectronic semiconductor part 35 with a conversion element 37 spaced apart from the chip 36, in accordance with the remote phosphor concept. In this case, the luminophore 38 is embedded into or surrounded by a metal phosphate matrix 39. This element 37 is applied to a substrate 40. The luminophore 38 preferably faces the chip 36 and the substrate 40 is transparent, for example, made of glass. The conversion element 37, comprising the conversion layer and the substrate, preferably homogenizes the radiated light. The luminophore-free side 41 of the substrate can additionally be roughened. Furthermore, the luminophore 38 can be specifically applied inhomogeneously in the horizontal direction, so that good chromatic homogeneity is ensured at all angles and the luminophore is utilized to the optimum extent. The remote phosphor solution described here is also usable if the radiation from a plurality of chips is to be converted simultaneously.

In place of an LED, an OLED can be used as the optoelectronic semiconductor element. In that case, the above considerations are at least as critical. The hermetic sealing of OLEDs is one of the greatest challenges.

The manufacturing of metal phosphates of this type is achieved, for example, by means of the known sol-gel method, from a soluble metal phosphate or from the product of the reaction of an alkoxide with phosphoric acid or from the product of the reaction of a metal salt or a metal hydroxide with phosphoric acid. By means of subsequent heat treatment, water-containing and/or carbon-containing components are driven off and the metal phosphate is then present in a polymerized form. Preferably, aluminum phosphate, yttrium phosphate or one of the above-mentioned metal phosphates or other rare earth phosphates is used because phosphates of this type have a high temperature-resistance and good moisture-resistance.

The metal phosphate can be present in amorphous, partially crystalline or crystalline form.

The invention is not restricted by the description based on the exemplary embodiments, but rather includes each novel feature and every combination of features contained in the claims, even if said feature or combination is not explicitly disclosed in the claims or exemplary embodiments.

The metal phosphate disclosed according to the invention can serve as:
an inorganic adhesive for fastening the conversion element, for example, a converter ceramic material and/or luminophore in glass, onto the board; in this case, the metal phosphate is preferably amorphous with good transmission in the UV region as far as the visible region (VIS).

an inorganic adhesive for fastening the lens to the housing;
an inorganic adhesive for fastening the glass cover onto the ceramic board;
an inorganic matrix of a conversion element in which the luminophore is embedded or the luminophore particles are bound to one another, in particular, directly onto the chip or as a remote phosphor concept; in this case, the metal phosphate is preferably amorphous with good transmission in the UV-VIS;
an inorganic protective layer on the luminophore particles which are thereby passivated and can then also be embedded in another matrix; in this case, the metal phosphate is preferably amorphous with good transmission in the UV-VIS;
a reflective component which, for example, entirely or partially replaces the costly titanium dioxide; in this case, the metal phosphate is preferably crystalline with good reflectivity in the UV-VIS;
a lens; in this case, the metal phosphate is preferably amorphous with good transmission in the UV-VIS;
a board/housing: in this case, a metal phosphate with a filler is advantageous. However, the metal phosphate can only be used for gluing ceramic or vitreous particles;
a cover layer of the conversion element, in order to protect said element against environmental influences; in this case, the metal phosphate is preferably amorphous with good transmission in the UV-VIS or is partially crystalline with an additional scattering and therefore homogenizing effect. The latter can also be achieved with small bubbles or scattering particles;
a functional coating, for example, antireflection coatings (for dereflecting), which lies above the conversion element; nanoparticles can additionally be added or a nanoporosity can be specifically adjusted.

It should be noted in this context that the different functions of the metal phosphate are achieved in that the composition thereof—in the example of aluminum phosphate, it is essentially the Al2O3-P2O5-H2O ratio—and the cross-linking during the heat treatment are adjusted to the respective usage purpose (transparency, cloudiness, opacity).

In the above cases, the metal phosphate can also contain vitreous or ceramic fillers which do not also fuse on. The proportion of filler or luminophore can be so high that the metal phosphate effectively only functions as a binding agent or adhesive which holds the filler particles together, similarly to a ceramic adhesive. Depending on the use and requirements, functional components can be added to the metal phosphate.

The thermal expansion coefficient of the metal phosphate is preferably at least $5.0 \times 10^{-6}$/K.

The metal phosphate contains, as the main component, phosphate which can be present in a variety of modifications, i.e. as orthophosphate, triphosphate, metaphosphate, polyphosphate, ultraphosphate and in all the possible intermediate steps.

Actual example embodiments will now be described in greater detail.

EXAMPLE 1

Inorganic Adhesive for Fastening the Conversion Element

An aqueous solution of a metal phosphate, for example, a monoaluminum phosphate Al(H2PO4)x.nH2O (e.g. FFB716 from Budenheim, in aqueous solution) is applied as a thin layer onto the chip and the conversion element is positioned on the moist layer. The application takes place with the usual coating methods, for example, dip-coating or spin-coating, screen printing, pad printing, spreading or spraying, etc. Drying at low temperatures (<150° C.) follows and possibly also at reduced ambient pressure and/or with the application of weight. The firing-on, that is the condensation takes place in the temperature range from 150° C. to 800° C. and preferably 200° C. to 400° C. Above 250° C., the triphosphate (AlH2P3O10) forms and above 500° C. or 600° C., long-chain and annular aluminum polyphosphates form.

The maximum firing-on temperature to be used is given by the temperature-resistance of the components. Preferably, the firing-on is carried out at temperatures in the range of 200° C. to 500° C. and, in particular, 250° C. to 350° C.

Optionally, solid materials in powder form, preferably nanopowders, for example, pyrogenic silicic acid (e.g. Aerosil from Evonik) and/or pyrogenic Al2O3 (e.g. Aeroxide Alu C from Evonik) and/or pyrogenic TiO2 (e.g. Aeroperl P25 from Evonik) which are then surrounded by the matrix, can be added to the suspension. Also possible is the addition of a ground soft glass, hard glass, quartz glass or a glass solder.

A further option is the addition of an aqueous solution of a different soluble metal salt, for example, yttrium acetate or yttrium phosphate, to the suspension. In this case, the components react with one another and the metal phosphate is thereby modified.

In order to fasten the lens to the housing and the glass cover to a ceramic board, a similar procedure is followed. It is also possible to add radiation-absorbing components, for example, spinels, iron oxide or vanadium oxide, to the suspension, thus enabling the adhesion surface to be heated in a targeted manner with, for example, IR radiation.

EXAMPLE 2

Inorganic Matrix of a Conversion Element

A luminophore, for example YaG:Ce in powder form, is suspended in an aqueous solution of a metal phosphate according to Example 1, and is applied to the chip as a layer. Subsequently, drying takes place at low temperatures (<150° C.), possibly also at reduced ambient pressure. The firing-on is carried out as per Example 1.

The luminophore content of the solid material can be varied depending on the desired color location of the LED. It is herein also possible to manufacture conversion elements which convert 100% of the light emitted by the chip. In this case, the solid material content of luminophore is so high that the metal phosphate used encloses the luminophore particles with only a thin layer and thereby glues said particles to one another.

Furthermore, it is possible to embed a mixture of different luminophore powders (different color locations) in the metal phosphate in order to adjust different light colors (for example, warm white, orange, etc.).

Optionally, solid materials in powder form and/or solutions of other soluble metal salts can be added to the suspension according to Example 1.

In the event that the conversion element is spaced apart from the chip (remote phosphor), in place of the chip, a transparent substrate, for example, glass with a high transmission in the VIS, is coated. Preferably, the side coated with luminophore faces the chip.

EXAMPLE 3

Inorganic Protective Layer on the Luminophore Particles

In an aqueous solution of a metal phosphate according to Example 1, luminophore, for example YAG:Ce in powder form is suspended and dried at low temperatures (<150° C.), possibly also at reduced ambient pressure. Surface-activating substances are possibly added in advance to the luminophore powder in order to influence the wetting process or to suppress agglomerate formation. The solid mass is subsequently comminuted and pulverized. The luminophore is now surrounded by a thin protective layer of metal phosphate. In order to produce the conversion element, the luminophore particles, together with the protective layer of metal phosphate now surrounding said particles, are now embedded in a matrix of, for example, silicon or glass.

Optionally, the metal phosphate can also be polymerized in advance, according to Example 1, by condensation.

Optionally, solid materials in the form of powders and/or solutions of other soluble metal salts can also be added to the suspension according to Example 1.

EXAMPLE 4

Reflective Components

Complete or partial replacement of the reflective component titanium dioxide in the LED board by the aluminum orthophosphate dihydrate described in DE 10 2007 031 960 A1 (manufacturing process and use).

EXAMPLE 5

Lens

The aqueous, preferably concentrated solution of a metal phosphate according to Example 1 is cast in a mold made, for example, of metal, graphite or plastics or, alternatively, directly onto the, possibly cast, conversion element. In the latter case, the convex form develops over the wetting angle. Subsequently, drying takes place at low temperatures (<150° C.), possibly also at reduced ambient pressure. Firing-on is carried out according to Example 1. Removal from the casting mold can be carried out following a moderate firing temperature and then, without the mold, higher temperatures are used. Subsequent treatment can possibly follow.

Optionally, solid materials in powder form and/or solutions of other soluble metal salts can be added to the suspension according to Example 1.

In a special embodiment, the lens also contains luminophore particles and therefore simultaneously acts as a conversion element which can possibly be applied directly onto the chip.

EXAMPLE 6

Board/Housing

An oxidic filler material, for example, glass, ceramic material or metal oxide in powder form is suspended in an aqueous solution of a metal phosphate according to Example 1 and is poured into a suitable mold. Subsequently, drying takes place at low temperatures (<150° C.), possibly also at reduced ambient pressure. Firing-on is carried out according to Example 1.

The oxidic filler content of the solid material can be varied.

In a special embodiment, the oxidic filler content of the solid material is high enough such that the metal phosphate used surrounds the filler material particles with only a thin layer and thereby glues said particles to one another.

In another special embodiment, the suspension is free of filler materials.

It is also possible to embed a mixture of various oxidic filler materials into the metal phosphate.

Optionally, solid materials in powder form and/or solutions of other soluble metal salts can also be added to the suspension according to claim 1.

EXAMPLE 7

Cover Layer of the Conversion Element

The conversion element is thinly coated with an aqueous solution of a metal phosphate according to Example 1 and dried at low temperatures (<150° C.), possibly also at reduced ambient pressure. The firing-on is carried out according to Example 1.

Optionally, the conversion element can also be cast with the metal phosphate.

As a further option, solid materials in powder form and/or solutions of other soluble metal salts can also be added to the suspension according to Example 1.

EXAMPLE 8

Functional Coating of the Conversion Element

As per Example 7. Preferably, the drying and condensation takes place here such that fine bubbles which reduce the refractive index form in the layer, so that an antireflection effect is produced. Alternatively, nanopowders can also be added.

In all the examples, components with a filter effect, for example, bismuth oxide or components which alter the refractive index, preferably increase the refractive index, for example, yttrium oxide or tellurium oxide are also added as soluble metal salts or as oxidic particles. The coefficient of expansion is preferably also adjusted by particles such as the particles mentioned in Example 1 and by materials with negative coefficients of expansion, for example, β-eucryptite.

Preferably, the phosphates introduced herein are manufactured by means of a sol-gel method. In general, a production method is often designed so that the starting materials are heated to over 250° C., condensed, and then water is eliminated so that long chains form. On further heating, for example, monocyclic chains are formed.

Concrete information is set out in detail in DE-A 101 13 287 and in J. Am. Ceram. Soc. Vor. 39/3, pp. 89-98 (1956).

The term phosphates also explicitly covers, in particular, monophosphates, for example, $Al(H_2PO_4)_3$ as well as polyphosphates, for example, $[Al(H_2PO_4)_3]_n$. Depending on the processing, metaphosphates, for example, $AlP_2O_7$ or tertiary phosphates, for example, $AlPO_4$ can form. Orthophosphates are formed on treatment at temperatures above approximately 180° C., polyphosphates and pyrophosphates are produced on treatment at temperatures above approximately 600° C. A starting point is a ratio of phosphorus oxide $[P_2O_5]$ to metal oxide, for example $[Al_2O_3]$, of 1:10 as a limit value.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An optoelectronic semiconductor part comprising a light source, a housing and electrical connections, wherein the optoelectronic semiconductor part comprises a component which contains metal phosphate, and wherein the metal phosphate contains no more than 1 mol-% of alkali oxides and halogen-containing components.

2. The optoelectronic semiconductor part as claimed in claim 1, wherein the metal phosphate contains phosphate as the main component.

3. The optoelectronic semiconductor part as claimed in claim 1, wherein the metal phosphate contains in the range of 5mol-% to 75mol-% of P2O5 and, in particular in the range of 5 mol-% to 25 mol-% Al2O3 or Y2O3.

4. The optoelectronic semiconductor part as claimed in claim 1, wherein in the range of 0.5 mol-% to 10 mol-% of vanadium V, tellurium Te and/or bismuth Bi is added to the metal phosphate in each case.

5. The optoelectronic semiconductor part as claimed in claim 1, wherein inorganic components which increase the refractive index and/or serve as fillers and/or act as optical filters and/or reflect and/or reduce reflection and/or absorb radiation are added to the metal phosphate.

6. The optoelectronic semiconductor part as claimed in claim 1, wherein the component which contains metal phosphate is an adhesive as a binding agent between two components of the semiconductor part.

7. The optoelectronic semiconductor part as claimed in claim 1, wherein the component which contains metal phosphate is a matrix for a conversion element.

8. The optoelectronic semiconductor part as claimed in claim 1, wherein the component which contains metal phosphate is a housing component or a lens.

9. The optoelectronic semiconductor part as claimed in claim 1, wherein the component which contains metal phosphate is a protective layer for luminophore particles.

10. The optoelectronic semiconductor part as claimed in claim 1, wherein the component which contains metal phosphate is a coating or a matrix of a coating of the conversion element.

* * * * *